(12) United States Patent
Imhof et al.

(10) Patent No.: US 8,935,981 B2
(45) Date of Patent: Jan. 20, 2015

(54) HIGH CONTRAST ALIGNMENT MARKS THROUGH MULTIPLE STAGE IMPRINTING

(75) Inventors: Joseph Michael Imhof, Austin, TX (US); Kosta S. Selinidis, Austin, TX (US); Dwayne L. LaBrake, Cedar Park, TX (US)

(73) Assignee: Canon Nanotechnologies, Inc., Austin, TX (US)

( * ) Notice: Subject to any disclaimer, the term of this patent is extended or adjusted under 35 U.S.C. 154(b) by 736 days.

(21) Appl. No.: 13/245,288

(22) Filed: Sep. 26, 2011

(65) Prior Publication Data

US 2012/0073462 A1    Mar. 29, 2012

Related U.S. Application Data

(60) Provisional application No. 61/385,993, filed on Sep. 24, 2010.

(51) Int. Cl.
  *G03F 7/00* (2006.01)
  *B82Y 40/00* (2011.01)

(52) U.S. Cl.
  CPC .............. *B82Y 40/00* (2013.01); *G03G 7/0002* (2013.01)
  USPC .................................... 101/463.1; 101/450.1

(58) Field of Classification Search
  CPC ...... G03F 9/708; G03F 9/7076; G03F 7/0002
  USPC ............. 101/450.1, DIG. 36, 463.1, 484, 486
  See application file for complete search history.

(56) References Cited

U.S. PATENT DOCUMENTS

| | | |
|---|---|---|
| 6,873,087 B1 | 3/2005 | Choi et al. |
| 6,916,584 B2 | 7/2005 | Sreenivasan et al. |
| 6,932,934 B2 | 8/2005 | Choi et al. |
| 6,936,194 B2 | 8/2005 | Watts |
| 6,958,280 B2 | 10/2005 | Kim |
| 7,070,405 B2 | 7/2006 | Sreenivasan et al. |
| 7,077,992 B2 | 7/2006 | Sreenivasan et al. |
| 7,136,150 B2 | 11/2006 | Sreenivasan et al. |
| 7,157,036 B2 | 1/2007 | Choi et al. |
| 7,179,396 B2 | 2/2007 | Sreenivasan |
| 7,281,921 B2 | 10/2007 | Watts et al. |
| 7,309,225 B2 | 12/2007 | McMackin et al. |
| 7,396,475 B2 | 7/2008 | Sreenivasan |
| 7,780,893 B2 | 8/2010 | Sreenivasan et al. |
| 7,837,907 B2 | 11/2010 | Nimmakayala et al. |
| 2004/0065252 A1 | 4/2004 | Sreenivasan et al. |
| 2004/0065976 A1 | 4/2004 | Sreenivasan et al. |

(Continued)

FOREIGN PATENT DOCUMENTS

| | | |
|---|---|---|
| EP | 0180091 | 5/1986 |
| KR | 10-0790899 | 12/2007 |
| WO | WO/03/003457 | 1/2003 |

OTHER PUBLICATIONS

Sreenivasan et al. U.S. Appl. No. 11/373,533, filed Mar. 10, 2006.

*Primary Examiner* — Judy Nguyen
*Assistant Examiner* — Jennifer Simmons
(74) *Attorney, Agent, or Firm* — Cameron A. King (57) ABSTRACT

Two-stage imprinting techniques capable of protecting fine patterned features of an imprint lithography template are herein described. In particular, such techniques may be used during fabrication of recessed high-contrast alignment marks for preventing deposited metal layers from coming into contact with fine features etched into the template.

15 Claims, 4 Drawing Sheets

(56) References Cited

U.S. PATENT DOCUMENTS

2005/0187339 A1  8/2005  Xu et al.
2008/0131791 A1* 6/2008  Cho et al. .................... 430/5
2010/0092599 A1  4/2010  Selinidis
2011/0192302 A1  8/2011  Selinidis

* cited by examiner

FIG. 10

HIGH CONTRAST ALIGNMENT MARKS THROUGH MULTIPLE STAGE IMPRINTING

CROSS-REFERENCE TO RELATED APPLICATION

This application claims priority to U.S. application Ser. No. 61/385,993 filed Sep. 24, 2010, which is incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

SUMMARY

Provided herein are methods capable of protecting fine patterned features of an imprint lithography template. These methods may be particularly useful in the fabrication of recessed high-contrast alignment marks on such templates by preventing deposited high contrast material (e.g. metal) layers from coming into contact with fine features etched into the template.

In one aspect, a method is provided for fabricating a template having high-contrast alignment marks that includes providing a template with a surface having both an alignment area and a fine feature area, each of which may have a plurality of protrusions and recessions, followed by forming a first layer over the fine feature area while leaving the alignment area exposed. A high contrast material, which can be a metal, is then deposited over both the alignment area and the first layer, the first layer protecting the fine feature area from coming in direct contact with the high contrast material. A second layer is then formed over the deposited high contrast material. A portion of the second layer is then subsequently removed such that a remaining portion of the second layer remains in recessions of the alignment area. The high contrast material is then removed such that only a portion of the high contrast material remains in the recessions of the alignment area. Finally the first layer is removed from the fine feature area along with the remaining portion of the second layer from the recessions of the alignment area, thereby exposing the fine feature area and the high contrast material in the recessions of the alignment area.

In another aspect, the first formed layer can be provided by first forming a forming a precursor layer over both the fine feature and alignment areas. The precursor layer can have differing thicknesses, such that the thickness over the fine feature area is greater than the thickness over the alignment. With such a configuration, portions of the precursor area can be removed or etched away a such that the alignment area becomes exposed while a portion of the precursor layer remains over fine feature area as the first layer.

The first, second, and/or precursor layers can be made of formable (polymerizable) material, and can be formed by varying techniques, including imprint lithography techniques. The second layer can further be planarized. Removal of the formed layers can be performed by e.g. descum etching. Removal of the high contrast material can be performed by e.g. RIE etching.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
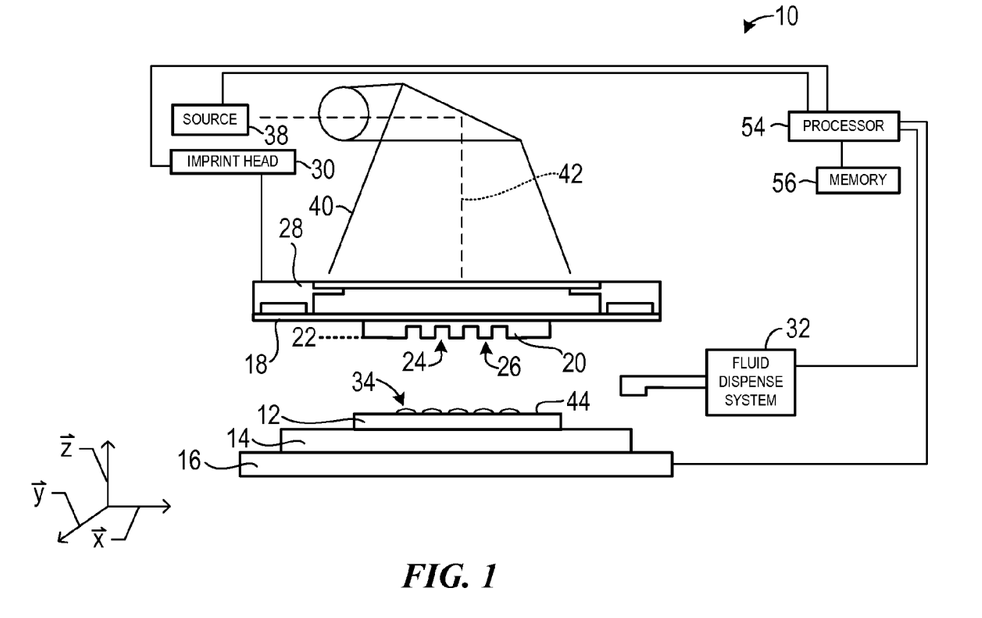
FIG. 1 illustrates a simplified side view of a lithographic system.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 having a patterning surface 22 thereon.

Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. Formable material 34 may be functional nano-particles having use within the bio-domain, solar cell industry, battery industry, and/or other industries requiring a functional nano-particle. For example, formable material 34 may comprise a monomer mixture as described in U.S. Pat. No. 7,157,036 and U.S. Patent Publication No. 2005/0187339, both of which are herein incorporated by reference. Alternatively, formable material 34 may include, but is not limited to, biomaterials (e.g., PEG), solar cell materials (e.g., N-type, P-type materials), and/or the like.

Figure 2:
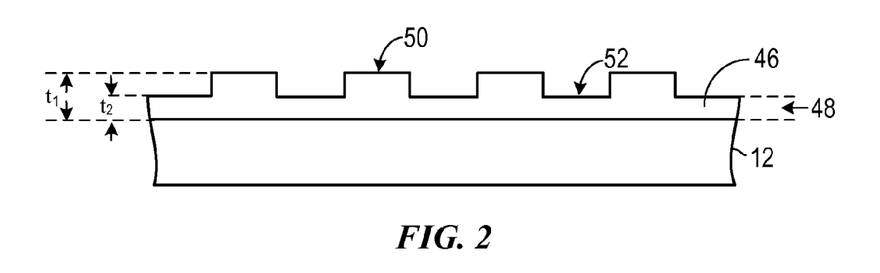
FIG. 2 illustrates a simplified side view of the substrate illustrated in FIG. 1, having a patterned layer thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Pat. No. 7,077,992, U.S. Pat. No. 7,179,396, and U.S. Pat. No. 7,396,475, all of which are hereby incorporated by reference in their entirety.

Alignment marks may aid in aligning template 18 and substrate 12 prior to imprinting formable material 34 in order to facilitate pattern transfer to a precise location on the substrate. Exemplary alignment systems and processes that may aid in the facilitation of pattern transfer are further described in U.S. Ser. No. 12/175,258, U.S. Ser. No. 11/695,850, U.S. Ser. No. 11/347,198, U.S. Ser. No. 11/373,533, U.S. Ser. No. 10/670,980, U.S. Ser. No. 10/210,894, and U.S. Ser. No. 10/210,780, all of which are hereby incorporated by reference herein in their entirety. Generally, such alignment marks may be etched into fused silica, a medium having a substantially similar index of refraction as formable material 34. As such, the alignment marks tend to remain isolated from formable material 34 in order to be visible with typical visible illumination methods. For example, trenches may be used to isolate alignment marks from formable material 34, as further described in U.S. Pat. No. 7,309,225, which is incorporated herein by reference. The minimum amount of space needed for a trench, however, is generally larger than a typical semiconductor scribe area. For example, the width of the trench, plus the minimum distance between alignment marks and edges needed to eliminate fluid-mark interference requires more space than a typical scribe area.

Additionally, the provision of such trenches may result in large open spaces on substrate 12 that may be detrimental to some processes such as chemical-mechanical planarization (CMP) and/or etching processes wherein uniformity and consistent feature density may be significant attributes. Such trench regions are also prime locations for defectivity.

To alleviate the need for such trenches or large open spaces, alignment marks may be formed of high contrast materials. The high contrast materials (HCM) used to form alignment marks may have different indices of refraction than formable material 34. As such, these alignment marks may be visible in the presence of formable material 34 for aligning processes.

High contrast alignment marks may be patterned in the same step as the primary patterning features of template 18. By patterning in the same step, pattern placement errors may be minimized. These alignment marks are generally etched to substantially the same depth as the primary features formed in substrate 12.

As described in U.S. Patent Publication No. 2010/0092599, which is herein incorporated by reference, some fabrication methods of high contrast marks utilize a single or multiple layers which must be patterned during substantially the same step as the main pattern. The main pattern may include features in the 5 to 32 nm range which are very difficult to pattern transfer with the required films for high contrast align marks. Further, the composition and thickness of a hard mask best suited to form high contrast alignment marks may be different than the composition and thickness of a hard mask needed for form the primary features.

As described in U.S. Patent Publication No. 2011/0192302, incorporated herein by reference, other fabrication methods can include single step patterning of alignment marks together with primary features followed by applying a high contrast material as a separate layer.

There maybe however complications associated with deposition of high contrast materials and subsequent removal of the same from primary or fine feature areas. For example, in some situations metal high contrast materials may bind or adhere irreversibly to the feature area such that the removal step is ineffective or incomplete in removing all the deposited metal from the primary or fine feature area. This in turn may cause defects in the resultant template. As such, two-stage imprinting techniques capable of protecting fine patterned features 24 and 26 of template 18 are herein described. In particular, such techniques may be used during fabrication of recessed high-contrast alignment marks for preventing deposited metal layers from coming into direct contact with fine features 24 and 26 that are subsequently etched into template 18. In addition, these techniques may have fewer processing steps and may result in less ambient particle exposure as compared to liftoff approaches seen within the prior art.

FIGS. 3-8 illustrate an exemplary method for formation of template 118 having high contrast alignment marks 60*a*. Generally, the method is a two-stage imprinting technique that includes (1) a feature-blocking imprint step prior to HCM deposition; followed by (2) a secondary planarizing imprint step subsequent to HCM deposition. These two distinct imprinting steps (e.g., resist deposition steps) provide protection of features 124 and 126 during fabrication of high contrast alignment marks 60*a*.

Figure 3:
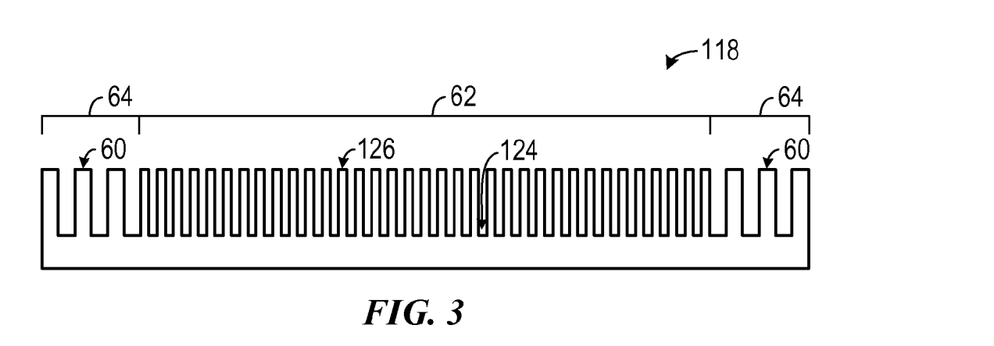
FIGS. 3-10 illustrate an exemplary method for formation of a template having high contrast alignment marks.

Referring to FIGS. 1 and 3, therein is shown an exemplary patterned template 118 for use in imprint lithography system 10. Template 118 may be substantially similar in concept and design to template 18. Template 118 includes a fine feature area 62 and an alignment area 64. Fine feature area 62 may include features having a critical dimension of less than approximately 50 nm. For example, fine feature area 62 may include recessions 124 and protrusions 126. Alignment area 64 may include features having a critical dimension of greater than approximately 50 nm. Such features may be used during alignment of template 118 with substrate 12 during an imprint lithography process. For example, alignment area 64 may include alignment marks 60. Template 118 itself can be formed by lithography processes and may utilize any patterning method including but not limited to electron-beam imprinting, optical lithography, laser lithography, nanoimprint lithography, and the like.

Figure 4:
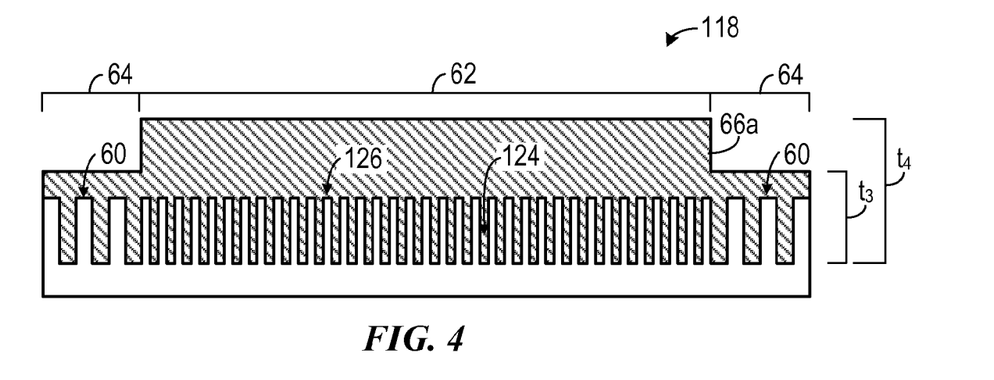

FIG. 4 illustrates one of the first two-stages of the two-stage imprinting technique for providing high contrast material in alignment marks 60 of template 118. In particular, FIG. 4 illustrates a feature-blocking imprint step. Generally, the feature-blocking step provides protection of fine feature area 62 during further processing steps (e.g., FIGS. 5-10). In one embodiment, the feature-blocking imprint step includes deposition of a layer of formable material (e.g., polymerizable material) on the entire template 118, which can be the same or similar to formable material 34. For example, the may be formed of materials including, but not limited to, a monomer mixture as described in U.S. Pat. No. 7,157,036 and U.S. Patent Publication No. 2005/0187339, both of which are herein incorporated by reference, and may be deposited using techniques including, but not limited to, drop dispense, spin-coating, dip coating, chemical vapor deposition (CVD), physical vapor deposition (PVD), thin film deposition, thick film deposition, and/or the like.

Figure 5:
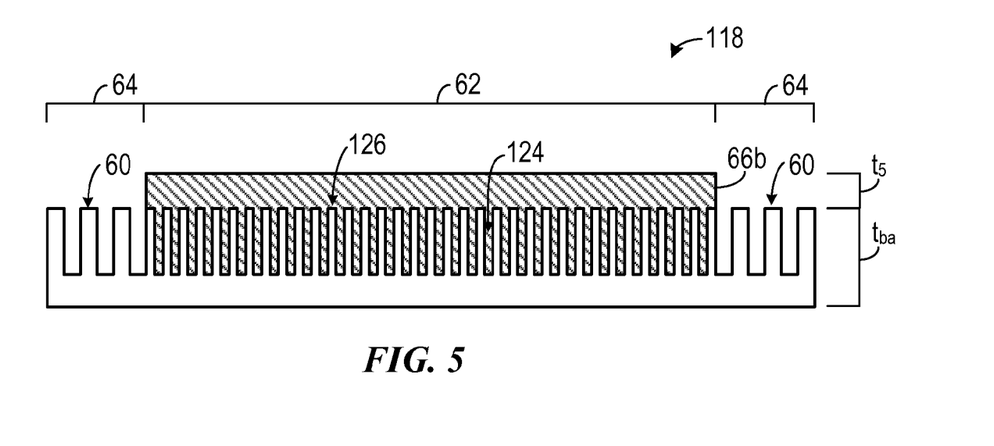

In one such embodiment, an initial or precursor layer 66*a* may be formed by, e.g., imprint lithography, to include a first thickness $t_3$ and a second thickness $t_4$. First thickness $t_3$ may be within alignment area 64 and second thickness $t_4$ may be within fine feature area 62. Thickness $t_4$ within fine feature area 62 may be substantially greater than thickness $t_3$ within alignment area 64. As such, a greater thickness $t_4$ within fine feature area 62 may protect features 124 and 126 during subsequent processing steps. As illustrated in FIG. 5, layer 66*a* may be etched (e.g., descum etch) within alignment area 64 such that it is removed within alignment area 64 and resultant layer 66*b* remains solely within fine feature area 62.

It should be noted that etching of initial or precursor layer 66*a* in alignment area 64 may decrease thickness $t_4$ of layer 66*a* within fine feature area 62. To that end, the thickness and desired etching rate of layer 66*a* may be configured such that at least a thickness $t_5$ of resultant layer 66*b* remains above protrusions 126 within fine feature area 62 as shown in FIG. 5.

In another embodiment, layer 66*b* may be deposited solely within fine feature area 62. Deposition of layer 66*b* solely within fine feature area 62 eliminates the etching step needed for removal of layer 66*a* within alignment area 64.

Figure 6:
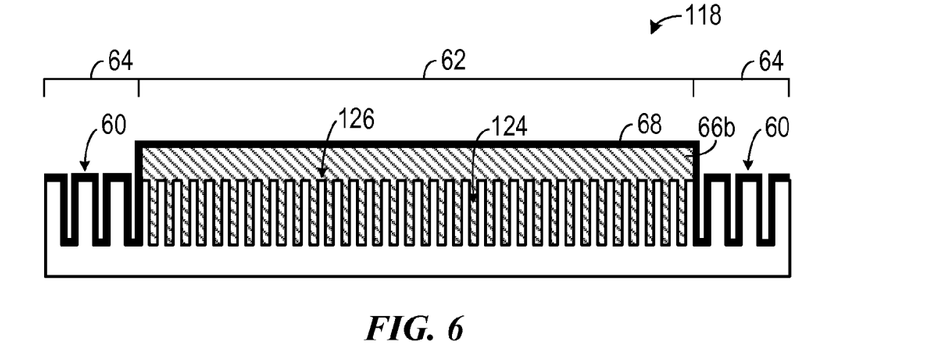

Referring to FIG. 6, high contrast material (HCM) may be deposited on template 118. Useful high contrast materials include, but are not limited to, tantalum, tungsten, silicon carbide, amorphous silicon, chromium, chromium nitride, molybdenum, molybdenum silicide, titanium, titanium nitride, and the like, which can be deposited on template 118 according to known methods. For example, in one embodiment, high contrast material may include chrome deposited by sputter coating. In another embodiment, high contrast material may include amorphous silicon deposited by CVD. In another embodiment, high contrast material may include diamond-like carbon (DLC) deposited by PVD. Deposition of high contrast material on template 118 may form a conformal layer 68 spanning alignment area 64 and fine features area 62. In one embodiment, thickness of conformal layer 68 may be between approximately 5 nm to greater than 100 nm, as illustrated in FIG. 5.

Figure 7:
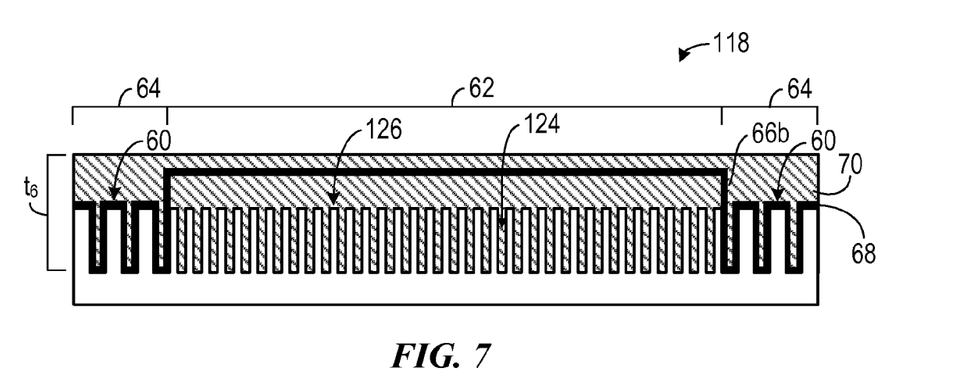

FIG. 7 illustrates the second stage of the two-stage imprinting technique. In particular, FIG. 7 illustrates a secondary planarizing imprint step. A second layer 70 of formable material (e.g., polymerizable material) may be deposited on high contrast conformal layer 68. Second layer 70 may be formed of materials that are the same as or substantially similar to first layer 66. Second layer 70 may span both fine feature area 62 and alignment area 64. Second layer 70 may be further planarized such that layer 70 remains with a substantially planar surface 71 and has a thickness $t_6$ between approximately 50 to 200 nm. Planarization may be by a nanoimprinting process using a planar template with material deposition techniques including, but not limited to, drop dispense, spin-coating, dip coating, chemical vapor deposition (CVD), physical vapor deposition (PVD), thin film deposition, thick film deposition, and/or the like.

Figure 8:
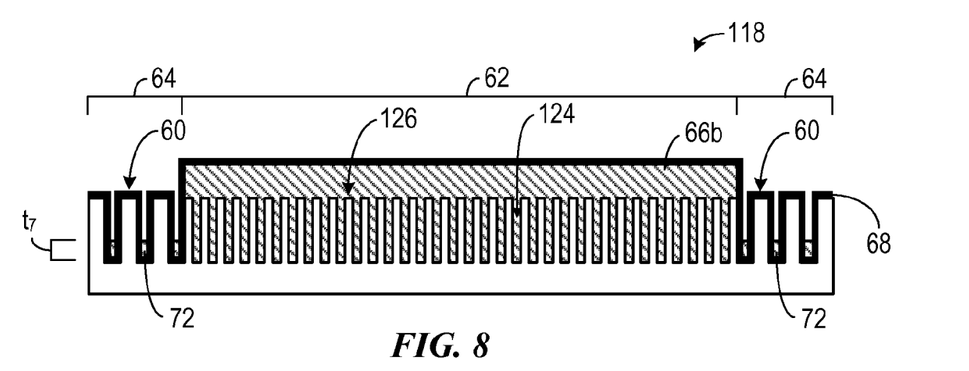

Referring to FIG. 8, second layer 70 may be etched (e.g., descum etch) such that portions 72 of second resist material layer 70 remain within recesses of alignment marks 60. Portions 72 remaining in recesses of alignment marks 60 may have a thickness $t_7$. Thickness $t_7$ may be at least 10 nm and can be thicker to afford greater protection. Portions 72 of second layer 70 provide protection of high contrast material in recesses of alignment marks 60 during subsequent etching steps.

Figure 9:
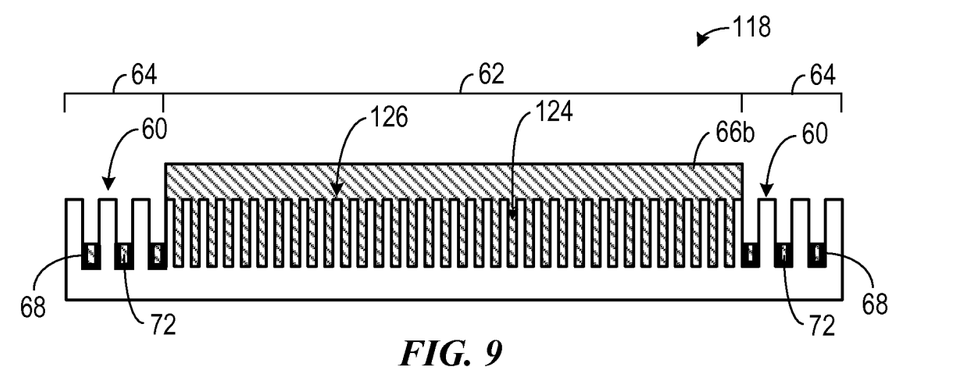
Figure 10:
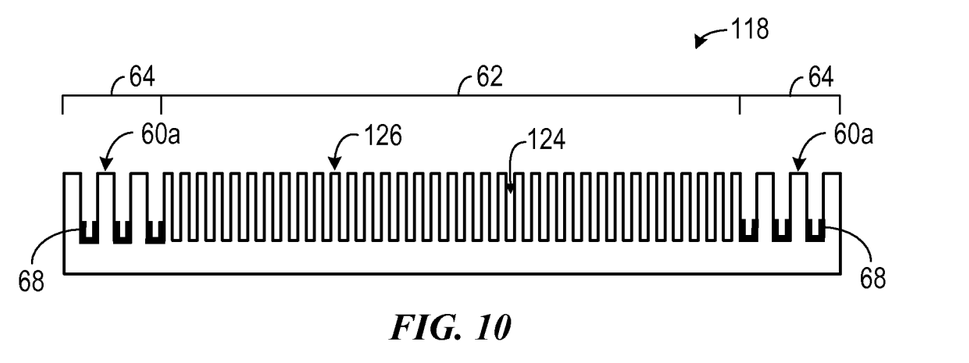

Referring to FIG. 9, high contrast conformal layer 68 may removed in all regions except recesses of alignment marks 60. Reactive ion etching (RIE) may be used to remove high contrast conformal layer 68, as well as other selective etch processes. For example, XeF2 gas may be used as it generally is effective at removal of a-Si, Ta, TaN, MoSi, MO, and W from a fused silica template surface with virtually no change to the fused silica pattern. Also, $Cl_2$ or $O_2$ based dry etch processes may be used as they have shown good selectivity when removing Cr, CrN, and CrO from a fused silica template surface. In addition, wet etch processes can be used to selectively remove the HCM from the fused silica, such as Cr7s Chrome stripper. Portions 72 of second layer 70 provide protection of high contrast material in recesses of alignment marks 60 during such removal or etching. Additionally, first layer 666 provides protection of fine feature area 62 during such etching. As illustrated in FIG. 10, portions 72 of second layer 70 and first layer 666 protecting fine feature area 62 may then subsequently be removed (e.g., descum etching) exposing high contrast material 68 within recesses of alignment marks 60 and fine feature are 62. Exposure of high contrast material 68 within recesses forms high contrast alignment marks 60*a*.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A method of fabricating a template having high-contrast alignment marks comprising the steps of:
    (a) providing a template having a surface having an alignment area and a fine feature area, each such area having a plurality of protrusions and recessions;
    (b) forming a first layer on the fine feature area;
    (c) depositing high contrast material on the alignment area and the formed first layer;
    (d) forming a second layer over the deposited high contrast material
    (e) removing a portion of the second layer such that a remaining portion of the second layer remains in the recessions of the alignment area;
    (f) removing a portion of the high contrast material such that a remaining portion of the high contrast material remains in the recessions of the alignment area;
    (g) removing the first layer from the fine feature area together with the remaining portion of the second layer from the recessions of the alignment area.

2. The method of claim 1 wherein the first layer is formed by dispensing a polymerizable material on the template surface, contacting the polymerizable material with an imprint lithography template, and solidifying the polymerizable material.

3. The method of claim 1 wherein forming the first layer further comprises:
    forming a precursor layer over both the fine feature and alignment areas, with the precursor layer having a first thickness over the fine feature area and a second thickness over the alignment area and where the first thickness is greater than the second thickness;
    removing a portion of the precursor layer such that the alignment area is exposed while a remaining portion of the precursor layer remains over fine feature area and defines the first formed layer.

4. The method of claim 3 wherein the precursor layer is formed by dispensing a polymerizable material on the template surface, contacting the polymerizable material with an imprint lithography template, and solidifying the polymerizable material.

5. The method of claim 3 wherein the removing the precursor layer portion further comprises a descum etch step.

6. The method of claim 1 wherein the second formed layer is planarized.

7. The method of claim 1 wherein the second layer is formed by dispensing a polymerizable material on the template surface, contacting the polymerizable material with an imprint lithography template, and solidifying the polymerizable material.

8. The method of claim 1 wherein the removing the second layer portion further comprises a descum etch step.

9. The method of claim 1 wherein the removing of the high contrast material step further comprises a reactive ion etching (RIE) step.

10. The method of claim 1 wherein the removing the first layer further comprises a descum etch step.

11. A method of fabricating a template having high-contrast alignment marks comprising the steps of:
    (a) providing a template having a surface having an alignment area and a fine feature area, each such area having a plurality of protrusions and recessions;
    (b) forming a first layer on the fine feature area by dispensing a polymerizable material on the fine feature area of the template surface, contacting the polymerizable material with an imprint lithography template, and solidifying the polymerizable material;
    (c) depositing high contrast material on the alignment area and the formed first layer;
    (d) forming a second planarized layer over the deposited high contrast material;
    (e) removing a portion of the second layer such that a remaining portion of the second layer remains in the recessions of the alignment area;
    (f) removing a portion of the high contrast material such that a remaining portion of the high contrast material remains in the recessions of the alignment area; and
    (g) removing the first layer from the fine feature area together with the remaining portion of the second layer from the recessions of the alignment area.

12. The method of claim 11 wherein the second layer is formed by dispensing a polymerizable material on the template surface, contacting the polymerizable material with an imprint lithography template, and solidifying the polymerizable material.

13. A method of fabricating a template having high-contrast alignment marks comprising the steps of:
    (a) providing a template having a surface having an alignment area and a fine feature area, each such area having a plurality of protrusions and recessions;
    (b) forming a precursor layer over both the fine feature and alignment areas, with the precursor layer having a first thickness over the fine feature area and a second thickness over the alignment area and where the first thickness is greater than the second thickness;
    (c) removing a portion of the precursor layer such that the alignment area is exposed and a remaining portion of the precursor layer defining a first formed layer remains over fine feature area;
    (d) depositing high contrast material on the alignment area and the formed first layer;
    (e) forming a second planarized layer over the deposited high contrast material
    (f) removing a portion of the second layer such that a remaining portion of the second layer remains in the recessions of the alignment area;
    (g) removing a portion of the high contrast material such that a remaining portion of the high contrast material remains in the recessions of the alignment area; and
    (h) removing the first layer from the fine feature area together with the remaining portion of the second layer from the recessions of the alignment area.

14. The method of claim 13 wherein the precursor layer is formed by dispensing a polymerizable material on the template surface, contacting the polymerizable material with an imprint lithography template, and solidifying the polymerizable material.

15. The method of claim 13 wherein the second layer is formed by dispensing a polymerizable material on the template surface, contacting the polymerizable material with an imprint lithography template, and solidifying the polymerizable material.

* * * * *